(12) United States Patent
Anderson et al.

(10) Patent No.: US 6,927,472 B2
(45) Date of Patent: Aug. 9, 2005

(54) FUSE STRUCTURE AND METHOD TO FORM THE SAME

(75) Inventors: David K. Anderson, Poughkeepsie, NY (US); Tien-Jen Cheng, Bedford, NY (US); Timothy J. Dalton, Ridgefield, CT (US); Christopher V. Jahnes, Upper Saddle River, NY (US); Andrew Lu, Wappingers Falls, NY (US); Chandrasekhar Narayan, Hopewell Junction, NY (US); Kevin S. Petrarca, Newburgh, NY (US); Richard P. Volant, New Fairfield, CT (US); George F. Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 09/992,344

(22) Filed: Nov. 14, 2001

(65) Prior Publication Data

US 2003/0089962 A1 May 15, 2003

(51) Int. Cl.$^7$ ............................................ H01L 21/336
(52) U.S. Cl. ........................ 257/529; 257/355; 257/665
(58) Field of Search ................................ 257/529, 173, 257/355, 665

(56) References Cited

U.S. PATENT DOCUMENTS

| | | | | |
|---|---|---|---|---|
| 4,198,744 A | * | 4/1980 | Nicolay | 438/601 |
| 4,491,860 A | | 1/1985 | Lim | |
| 4,498,068 A | * | 2/1985 | Gaia | 337/293 |
| 4,679,310 A | | 7/1987 | Ramachandra et al. | |
| 4,796,075 A | | 1/1989 | Whitten | |
| 4,931,353 A | | 6/1990 | Tanielian | |
| 5,196,819 A | * | 3/1993 | Roberts | 337/297 |
| 5,244,836 A | | 9/1993 | Lim | |
| 5,360,988 A | * | 11/1994 | Uda et al. | 257/529 |
| 5,451,811 A | | 9/1995 | Whitten et al. | |
| 5,485,137 A | * | 1/1996 | Maleus et al. | 337/295 |
| 5,523,253 A | | 6/1996 | Gilmour et al. | |
| 5,751,537 A | * | 5/1998 | Kumar et al. | 361/234 |
| 5,757,060 A | * | 5/1998 | Lee et al. | 257/529 |
| 5,780,918 A | | 7/1998 | Aoki | |
| 5,863,407 A | * | 1/1999 | Kiyokawa | 205/159 |
| 5,882,998 A | | 3/1999 | Sur, Jr. et al. | |
| 5,903,041 A | | 5/1999 | La Fleur et al. | |
| 6,055,150 A | * | 4/2000 | Clinton et al. | 361/234 |
| 6,143,642 A | | 11/2000 | Sur, Jr. et al. | |
| 6,160,302 A | | 12/2000 | Palagonia | |
| 6,242,789 B1 | * | 6/2001 | Weber et al. | 257/529 |
| 6,359,443 B1 | * | 3/2002 | Endo et al. | 324/539 |
| 6,495,426 B1 | * | 12/2002 | Cheng et al. | 438/393 |
| 6,495,901 B2 | * | 12/2002 | Brintzinger et al. | 257/529 |
| 2002/0011645 A1 | * | 1/2002 | Bertin et al. | 257/529 |
| 2002/0101324 A1 | * | 8/2002 | Kawashima et al. | 337/260 |
| 2002/0113291 A1 | * | 8/2002 | Adkinsson et al. | 257/529 |

FOREIGN PATENT DOCUMENTS

| | | | | |
|---|---|---|---|---|
| DE | 198 03 605 | * | 8/1999 | |
| FR | 2 575864 | * | 7/1986 | |
| JP | 3-270255 | * | 2/1991 | |
| JP | 3-124047 | * | 5/1991 | |
| JP | 11-31446 | * | 2/1999 | |
| JP | 2000-243200 | * | 9/2000 | |
| JP | 2001-223272 | * | 8/2001 | |

* cited by examiner

Primary Examiner—Nathan J. Flynn
Assistant Examiner—Ahmed N. Sefer
(74) Attorney, Agent, or Firm—McGinn & Gibb, PLLC; Ira D. Blecker, Esq.

(57) ABSTRACT

A method and structure for a fuse structure comprises an insulator layer, a plurality of fuse electrodes extending through the insulator layer to an underlying wiring layer, an electroplated fuse element connected to the electrodes, and an interface wall. The fuse element is positioned external to the insulator, with a gap juxtaposed between the insulator and the fuse element. The interface wall further comprises a first side wall, a second side wall, and an inner wall, wherein the inner wall is disposed within the gap. The fuse electrodes are diametrically opposed to one another, and the fuse element is perpendicularly disposed above the fuse electrodes. The fuse element is either electroplatted, electroless plated, or is an ultra thin fuse.

15 Claims, 3 Drawing Sheets

FUSE STRUCTURE AND METHOD TO FORM THE SAME

BACKGROUND OF THE INVENTION

1. Field of the Invention

The present invention generally relates to fuses included within semiconductor structures which protect semiconductor devices from excessive voltage and/or current or which selectively and permanently connect/disconnect semiconductor devices from one another.

2. Description of the Related Art

As the size and voltage/current ratings of semiconductor devices becomes smaller, as a result of device miniaturization, the fuses which protect or disconnect such devices must be opened ("blown") with smaller amounts of energy to accommodate the delicacy of todays semiconductor products. In an effort to reduce and/or eliminate the damage caused to the product when the fuses are blown, designers have been patterning fuses in various manners to solve this problem and to reduce costs as well.

There are several kinds of integrated circuit applications that require some form of electrically programmable memory for storing information. The information stored varies significantly in size ranging from a few bits used to program simple identification data, to several megabits used to program computer programs. Fabricating these types of memory devices along with core logic integrated circuitry adds a number of additional processing steps that significantly raise product costs. Usually, the additional product costs are difficult to justify when only relatively small amounts of electrically programmable elements are needed for a particular integrated circuit application.

As such, in order to reduce costs, semiconductor designers have been implementing "fuse" structures that are made out of existing doped polysilicon layers that are typically patterned to define transistor gates over a semiconductor structure. Once formed, the fuse structure may be "programmed" by passing a sufficiently high current that melts and vaporizes a portion of the polysilicon fuse. In the programmed state, the fuse structure typically has a resistance that is substantially greater than the non-programmed state, thereby producing an open circuit. This is of course counter to antifuse devices that become short circuits (i.e., substantially decreased resistance) in a programmed state. Although traditional fuse structures work well, they typically consume a large amount of power in programming that may make them unfit for a variety of low power integrated circuit products.

Current back end fuses are made of aluminum or copper and formerly were made of tungsten. Polysilicon is used in the front end of the chip which can tolerate high temperatures (this is the device end not the interconnect end).

Currently, fuses are made in semiconductors within the chip. However, the prior art is bereft of devices in which fuses are plated at the uppermost level. Moreover, the prior art is devoid of devices in which a damascene process is used to form the fuse structure at the uppermost level. Because softer and inherently weaker materials that will pass oxygen through them are beginning to be used by designers and manufacturers, there is a need to create easily fabricated fuses that will not damage the product when they are blown.

SUMMARY OF THE INVENTION

In view of the foregoing and other problems, disadvantages, and drawbacks of the conventional fuse structures the present invention has been devised, and it is an object of the present invention to provide a structure and method for a plated fuse structure, which will not damage the product they are configured for, when the fuse is blown.

In order to attain the object suggested above, there is provided, according to one aspect of the invention a method and structure for a fuse structure comprising an insulator layer, a plurality of fuse electrodes extending through the insulator layer to an underlying wiring layer, an electroplated fuse element connected to the electrodes, and an interface wall, wherein the fuse element is positioned external to the insulator, with a gap juxtaposed between the insulator and the fuse element. The interface wall further comprises a first side wall, a second side wall, and an inner wall, wherein the inner wall is disposed within the gap. The fuse electrodes are diametrically opposed to one another and the fuse elements are perpendicularly disposed above the plurality of fuse electrodes.

By plating a material, such as nickel, the fuse can be exposed to air. Nickel is self-passivating and thereby it is also a good oxygen barrier. The steps of forming the vias and troughs (fuse) in an insulator are deposition followed by a lithography/etching process to form the vias and the troughs. Next, deposition of liner/barrier/seed by depositing a suitable material (i.e., nickel) occurs, and lastly, a chemical mechanical polish is performed.

These steps should be familiar to anyone who is skilled in the art. Prior art for the back end of the line fuses do not accommodate low modulus materials being used as an interlevel dielectric below the fuse. When the fuse is blown, damage occurs and can cause the chip to become nonfunctional. Current fuses are made of aluminum which is formed by using a rie process. The aluminum is a blanket deposited and etched off in the areas that it is not desired. This also means that if there is any nonuniformity in the metal deposition, it will remain there, causing a differential in the power needed to blow the fuses across the substrate. The current thickness of the aluminum is also problematic, wherein the thickness gives rise to the chance of extraneous aluminum being displaced onto nearby structures thereby causing a short. The present invention is thinner, and therefore, there is less material to be displaced.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
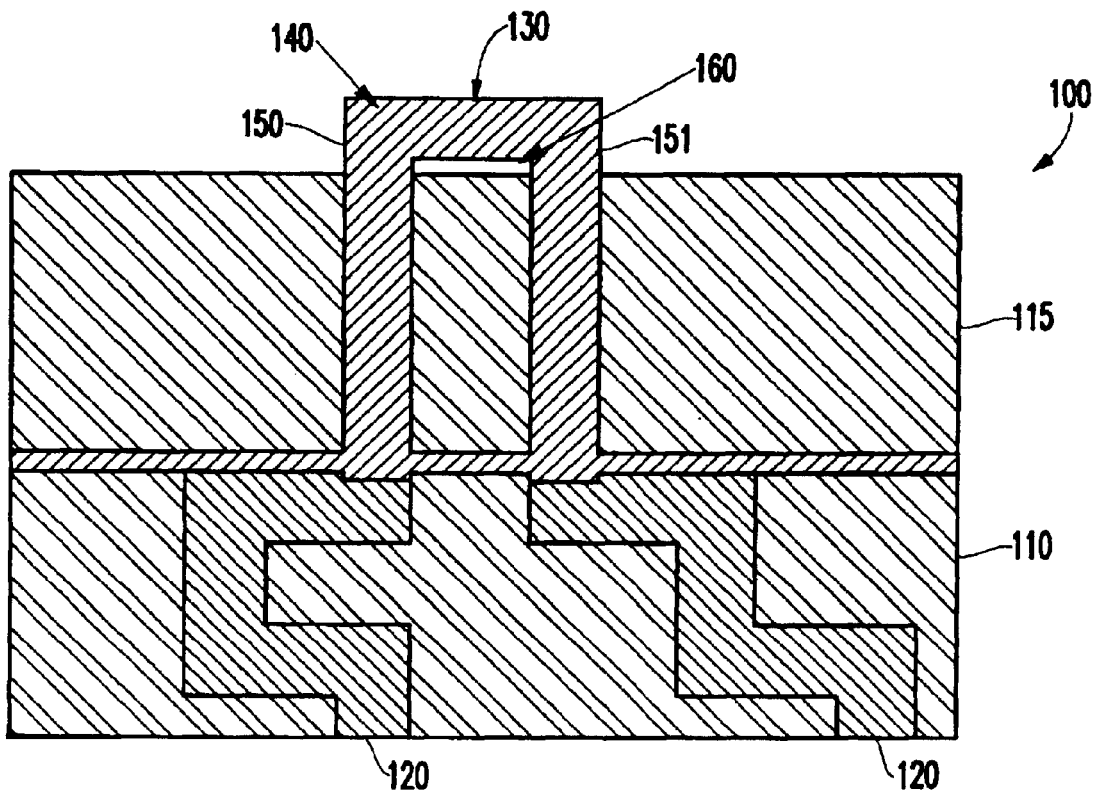
FIG. 1 is a cross-sectional schematic diagram of a fuse structure according to the present invention.

Referring now to the drawings, and more particularly to FIG. 1, there are shown preferred embodiments of the method and structure according to the present invention. Referring to FIGS. 1–7, a first embodiment of the present invention will be described below.

The present invention pertains to a fuse, which is a plated structure that is fabricated in a damascene fashion.

The present process provides for electroplating. Additionally, an electroless plating with materials such as NiP could be used, as would be common knowledge for those skilled in the art.

Depending on the material that is chosen to plate the fuse structure with, the insulating material can be etched away from the section of the fuse that needs to be blown. This will decrease the amount of damage that the final passivation layer (insulator layer) will receive.

The damage is decreased in two ways. First, by using a damascene process, the fuse can be made very thin compared to current fuses. The thickness will be determined by the skill level of the fabricators in the area of CMP (chemical mechanical polish). Fuses of aluminum are currently greater than 1 μm thick. Thinner metal structures can be made with damascene processing. Currently, metal levels that are 0.2 μm thick can be made. Because there is less material to blow, the forces associated with that action can be reduced. Then, by using a resilient metal such as nickel, there is the option of etching the insulator after the chemical mechanical polish and not etching the fuse; the fuse acts as a mask. This allows the fuse to be physically residing above the insulator and helps inhibit the transfer of energy from the fuse blow.

In the current disclosure nickel may be used as the electroplating material, but many metals can be used that are common with electroplating. Nickel offers a metal that can be electroplated, easily polished, is self passivating and can be fabricated simultaneously during another process. There are several options for the material to be used other than nickel, such as aluminum, tungsten, gold, or copper.

In FIG. 1, there is shown a fuse structure 100 comprising a wiring layer 110 further comprising a plurality of wire elements 120 interspersed therein. A final passivation layer (insulator layer) 115 is shown on top of the wiring layer 110. A fuse portion 130 of the fuse structure 100 is shown as an inverted U-shaped device. However, those skilled in the art will recognize that any geometric configuration may be used for the fuse portion 130. The fuse portion 130 further comprises a generally horizontal electroplated fuse element 140, with a pair of fuse electrodes 150, 151 extending downwardly therefrom. The fuse electrodes 150, 151 contact the plurality of wire elements 120 in the wiring layer 110 of the fuse structure 100. Finally, an air gap 160 is shown juxtaposed between the fuse element 140 and the top of the passivation layer (insulator layer) 115. The air gap 160 is open from the front and rear sides, as opposed to being sealed. Further, the fuse element 130 contacts the wire elements 120 through the pair of fuse electrodes 150 and 151. However, the fuse element 130, itself, is not in contact with the underlying structure. This allows all surfaces of the fuse element to be plated.

Figure 2:
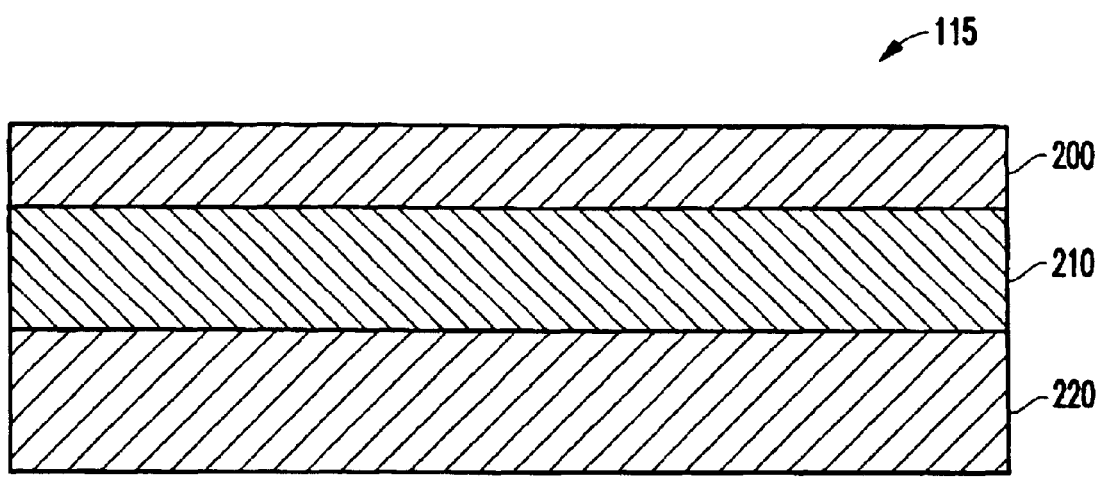
FIG. 2 is a cross-sectional schematic diagram of a fuse structure according to the present invention.

FIG. 2 illustrates the final passivation layer 115 more thoroughly. As shown, the final passivation layer 115 comprises a top layer 200, a middle layer 210, and a bottom layer 220. The top layer 200 can be any thickness and preferably comprises 3.5 kilo angstroms of silicon dioxide. The middle layer 210 preferably comprises 4.0 kilo angstroms of silicon nitride. The bottom layer 220 preferably comprises 4.5 kilo angstroms of silicon dioxide.

Figure 3:
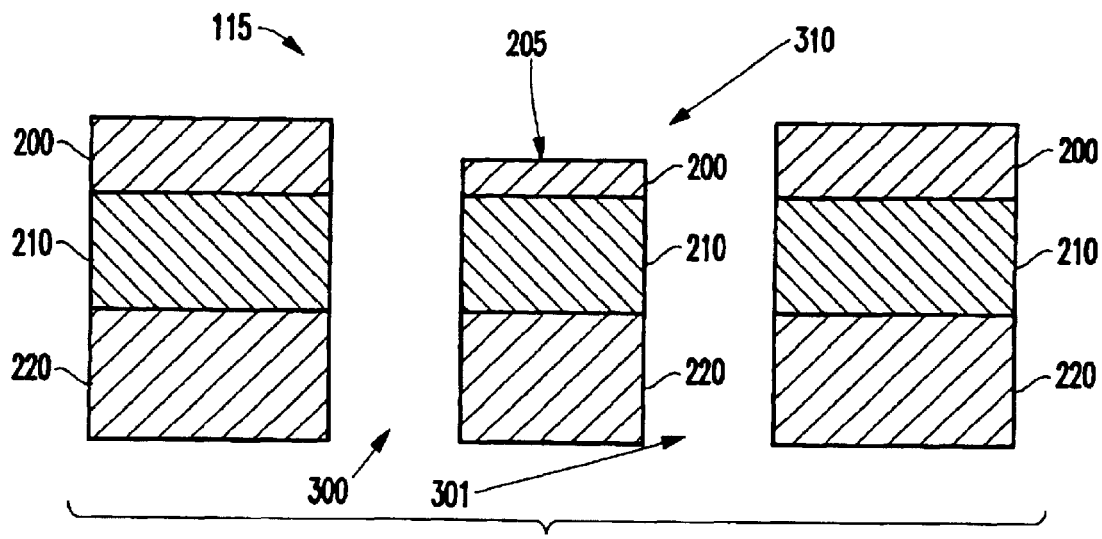
FIG. 3 is a cross-sectional schematic diagram of a fuse structure according to the present invention.

FIG. 3 shows the fuse structure 100 undergoing a damascene process. Here, a plurality of voids 300, 301 are made in the insulator layer 115 using any well-known technique such as lithographic patterning. As shown, the top layer 200 of the insulator layer 115 is further reduced in height 205 in the portion of the insulator layer 115 disposed in between the voids 300, 301. The height difference is created by utilizing lithography and etch. The first lithography/etch forms the vias, and a second lithography/etch forms the fuse. The etch is different for each of the features, but this would be common knowledge for anyone skilled in the art. Voids 300 and 301 are formed at the same time and the reduction in height 205 is formed at a different time (the decision to form the vias first or the fuse first is discretionary). If there is insufficient skill to etch top layer 200 partially, one could make top layer 200 the desired thickness of the fuse and use the middle layer 210 as an etch stop. This would mean that a selective etch would be required which is not uncommon in the industry.

Figure 4:
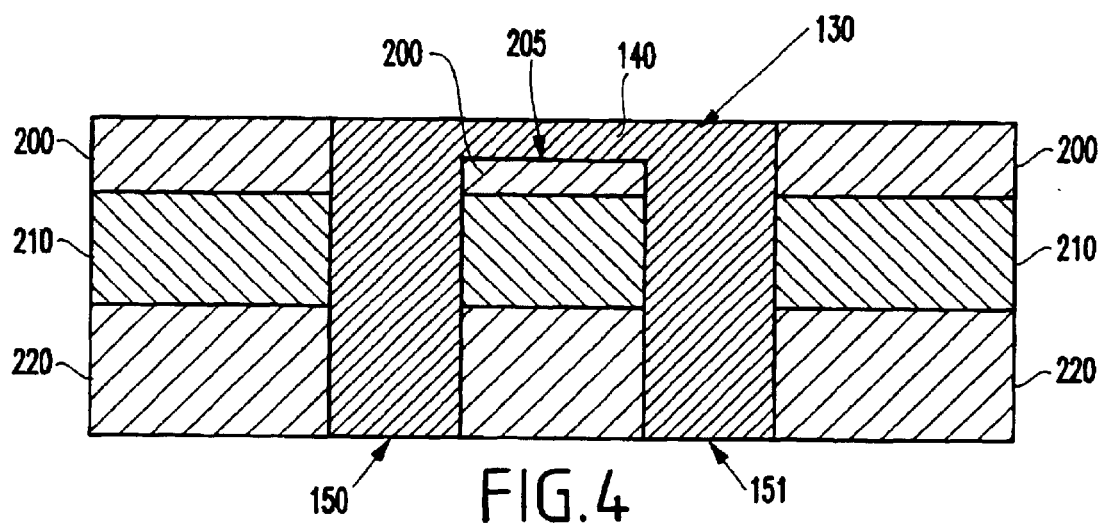
FIG. 4 is a cross-sectional schematic diagram of a fuse structure according to the present invention.

In FIG. 4, the fuse/electrode material 130 of the fuse structure 100 is shown to fill the voids 300, 301. The fuse/electrodes 150, 151 fill the voids 300, 301, and the fuse element 140 rests atop the top layer 200 of the insulator layer 115, whereby the fuse element 140 is flush with the top layer 200 of the insulator layer 115 located on the sides of the fuse structure 100, and the height-reduced insulator layer 205 is between the underside of the fuse element 140 and the upper portion of the middle layer 210 of the insulator layer 115. The material selected for the fuse electrode material 130 may be nickel, gold, etc. . . . , or any similar material capable of being electroplated in a similar fashion. The fuse/electrode material 130 can be deposited using any conventional damascene process, such as chemical vapor deposition (CVD), liquid phase deposition, and ion physical vapor deposition (IPVD), etc.

Figure 5:
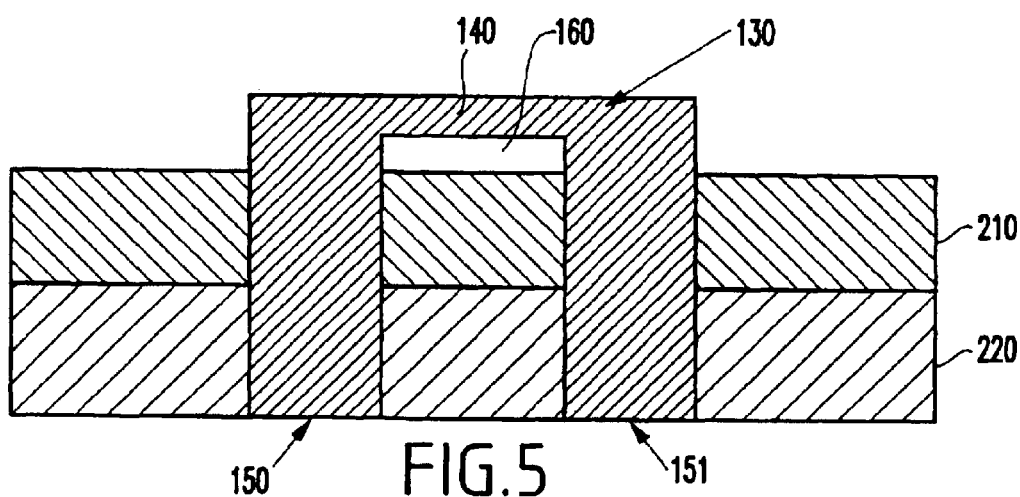
FIG. 5 is a cross-sectional schematic diagram of a fuse structure according to the present invention.

FIG. 5 shows the fuse structure 100 undergoing an etching process, whereby the top layer 200 of the insulator layer 115 is removed. The height-reduced insulator layer 205 is simultaneously removed during this etching (for example, a wet etch). This removal of the top layer 200, and the height-reduced insulator layer 205 creates an open air gap 160 between the fuse element 140 and the middle layer 210 of the insulator layer 210. Furthermore, the etching allows the fuse portion 130 to protrude from the insulator layer 115, whereby the fuse element 140 is no longer flush with the insulator layer 115.

Figure 6:
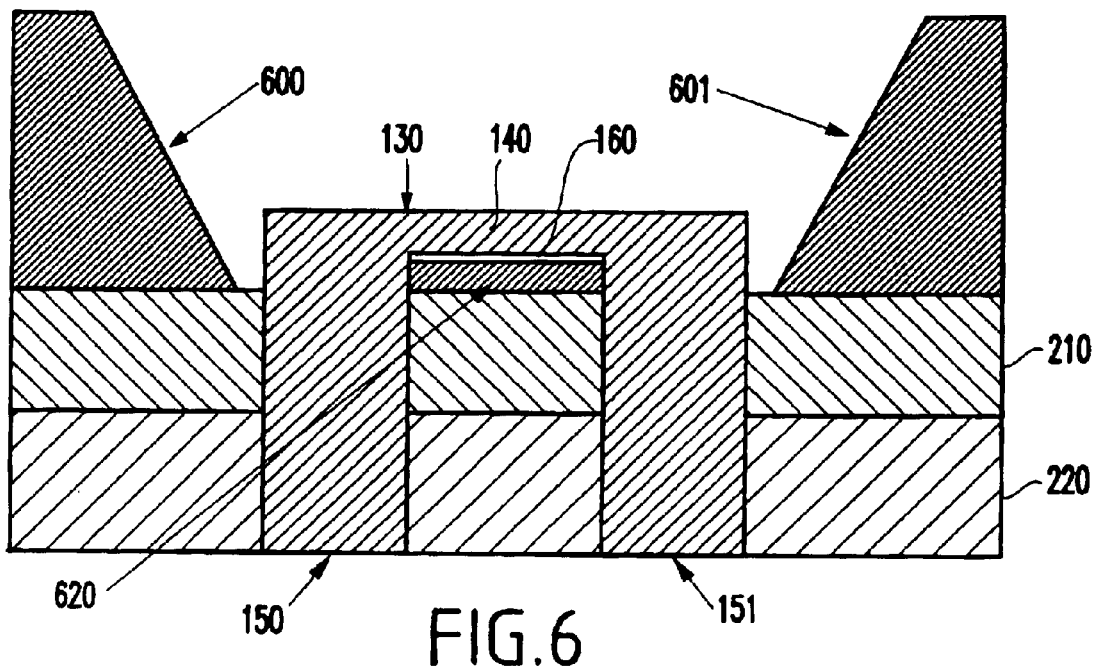
FIG. 6 is a cross-sectional schematic diagram of a fuse structure according to the present invention.

Next, as shown in FIG. 6, the fuse structure 100 is shown with a plurality of PSPI (photosensitive polyimide) walls 600, 601, and a residual PSPI wall 620 disposed within the air gap 160. However, the residual PSPI wall 620 does not completely fill the air gap 160. Thus, an air gap 160 still remains intact. PSPI is made in different tones. The PSPI is coated on the substrate much the same way as the photoresist is applied. The only difference is that the PSPI is usually a much more viscous polymer. After the application, the PSPI is "soft baked" on a hot plate, which is well known in the art. The PSPI is then exposed in lithography using normal lithographic techniques. The PSPI is then developed, which means for the positive tone, the PSPI will remain on the substrate any place that the light does not expose the PSPI.

For more advanced reactive ion etching capabilities, the first embodiment for the formation of the reduction of height 205 in FIG. 3 comes into force here. After the fuse is metalized a selective etch can be used to undercut the fuse. This means that the silicon dioxide will be removed from under the fuse. This fuse width is in the order of 0.5 μm, this dimension lends itself to making the undercut easier. The limit of the ability of the etch to undercut the structure is determined by the abilities of the fabricators skilled in the art.

Since the fuse shadows some of the PSPI that will flow under it in the air gap 160 in FIG. 1, the fuse acts as a mask allowing the PSPI to remain under the fuse. This may act as a cushion when the fuse blow takes place.

Figure 7:
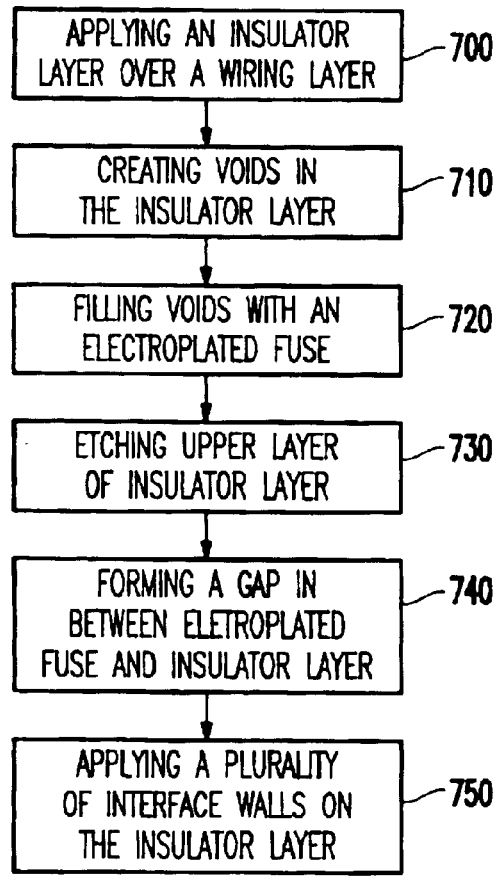
FIG. 7 is a flow diagram of a preferred method of the present invention.

FIG. 7 details the method in which the fuse structure is produced. First, an insulator layer 115 is applied 700 on top of a wiring layer 110. Then, voids 300, 301 are created 710 in the insulator layer 115 and the height of area 205 is reduced. Next, the voids 300, 301 are filled 720 with an electroplated fuse portion 130. After which, the upper layer 200 of the insulator layer 115 is etched 730. This forms 740 a gap 160 between the electroplated fuse portion 130 and the insulator layer 115. Finally, a plurality of interface walls 600, 601, 620 are disposed 750 on the insulator layer 115.

In a second embodiment, the final passivation layer is left without the top layer 200. The fuse element 140 in FIG. 1 is formed in the middle layer 210 of FIG. 2. This makes the formation of the air gap 160 very difficult to fabricate. However, the benefits are that there are less processing steps to form the structure, which uses the thickness of the fuse as the singular more important item in the alleviation of fuseblow induced damage.

Here, the ability to make the fuse very thin is available since a damascene process is being used. The depth of the fuse section that is to be blown may be as thin as a metal deposition tool can cover a two level structure. That is, the metal can be thinned to the point until it becomes non-continuous. This allows the fuse to be blown with the lower power required in today's advanced electronics. For example, if a conventional damascene process is used to form the electrode/fuse material 130 (e.g., forming layers of 100 angstroms of TaN and 100 angstroms of Ta) the resulting fuse could be as thin as 200 angstroms.

The present invention is unique in that a seed material must be deposited (i.e., IPVD copper, sputtered nickel, electroless NiP, W, etc.). The thickness of these materials requires only that the material remain continuous. For example, thicknesses of 100–350 angstroms have been achieved. Then, the electroplated material is deposited, such as Ni, NiP, or any conductor that will plate off the seeds that are to be used. Electroplating and electroless plating are well-known processes and thoroughly documented. After the plating, the substrate is polished (CMP) to make all the fuses uniform.

Currently, fuse electrodes 150 and 151 are formed and then, a thick (greater than 1 $\mu$m) aluminum layer is deposited. Lithography leaves photoresist on all the areas that are needed to remain on the substrate. The substrate is then etched to remove the unwanted aluminum leaving the fuse on the top. The fuse that is made is very thick and the uniformity is dependant on the ability of the aluminum deposition tooling capabilities.

The present invention cannot be used for antifuse devices because antifuses deal with breaking down a dielectric to form a connection. Whereas in the present invention, there is an opening in a conductor to prevent continuity.

The process for electroplating begins by first starting the electroplating process with the structure shown in FIG. 2. Next, a line/barrier/seed is deposited. Third, the substrate is electroplated; and fourth, a CMP is performed to planarize the substrate and polish off the plated material between structures. If electroless plating is used, then step 3 would be an electroless activation layer (i.e. Pd for NiP) deposition followed by electroless plating.

An alternate embodiment involves the use of other deposited conductors. For example, liner materials for the fuse could be used. If a material such as TaN is used, then depositing as little as the material would allow to become a hermetic seal for the level below would be utilized. As such, 350 angstroms would be sufficient for this requirement. Other materials could be W, Ti, Ta, Sn, TiW, etc.

The depth of the level 310 in FIG. 3 would be dependant on the abilities of the CMP process. If the process lends itself to dishing, a deeper level 310 would be needed. Dishing refers to the flexing of a pad during the CMP process and removing material that was meant to remain. For the normal polishing techniques that are used, level 310 could be as shallow as 200 angstroms. Other fabricators would need to determine the abilities of their polishing process to determine the depth requirement.

The advantage of using a material like TaN is that it can be used as a mask even if it is very thin (less than 1,000 angstroms). This would allow the ability to form the air gap 160 with an ultra-thin fuse.

Summarily, the present invention provides for the following three processes. First, for an electroplated fuse, beginning with the structure shown in FIG. 3, a liner/barrier/seed is applied. After electroplating, a CMP is performed. Then, the PSPI is applied, and a lithography is performed and developed. Lastly, a PSPI cure is performed. Secondly, for an electroless plating fuse, the process begins with the structure shown in FIG. 3. Then a liner/barrier/seed is applied. Next, an activation layer electroless plate is deposited. After performing a CMP the structure is etched. Next, the PSPI is applied, and a lithography is performed and developed followed by a curing process. Lastly, for an ultra thin fuse, the process begins with the structure shown in FIG. 3. Next, a liner/barrier (fuse material) is applied. After performing a CMP the structure is etched. Next, the PSPI is applied, and a lithography is performed and developed followed by a curing process.

The first two processes allow the fabricator to build other structures at the same time with the same materials. This makes the process more manufacturable and more cost effective. The last option applies if the fabricator needed the thinnest possible fuse, which would probably be for a very high-end application, where the cost is offset by the need for effect performance of the fuse and an ability to blow it with very low power.

While the invention has been described in terms of preferred embodiments, those skilled in the art will recognize that the invention can be practiced with modification within the spirit and scope of the appended claims.

What is claimed is:

1. A fuse structure comprising:
   an insulator layer; and
   a continuous conductive inverse-U shaped fuse extending through said insulator layer to an underlying wiring layer, and
   wherein a portion of said fuse is positioned external to said insulator, with a gap juxtaposed between said insulator and said portion of said fuse.

2. The fuse structure in claim 1, wherein said portion of said fuse is electroplated.

3. The fuse structure in claim 1, wherein said portion of said fuse is electroless plated.

4. The fuse structure in claim 1, wherein said fuse has a thickness in range of 100 angstroms to 350 angstroms.

5. The fuse structure in claim 1, wherein said portion of said fuse is perpendicular to and above said insulator layer.

6. The fuse structure in claim 1, further comprising an interface wall, wherein said interface wall further comprises a first side wall, a second side wall, and an inner wall, wherein said inner wall is disposed within said gap.

7. The fuse structure in claim 1, wherein said portion of said fuse is surrounded by air.

8. A fuse structure comprising:

an insulator layer; and a continuous conductive inverse-U shaped fuse extending through said insulator layer to an underlying wiring layer, and wherein a portion of said fuse is positioned external to said insulator, wherein said portion of said fuse is perpendicular to and above said insulator layer.

9. The fuse structure of claim 8, wherein said portion of said fuse is one of electroplated and electroless plated.

10. The fuse structure in claim 8 further comprising an interface wall, wherein said interface wall further comprises a first side wall, a second side wall, and an inner wall.

11. The fuse structure in claim 8, wherein said portion of said fuse is surrounded by air.

12. An integrated circuit structure comprising:

a wiring layer having wiring elements;

an insulator layer covering said wiring layer; and a continuous conductive inverse-U shaped fuse extending completely through said insulator layer and being connected to said wiring elements, wherein said insulator layer forms an external surface of said integrated circuit structure and a portion of said fuse extends beyond said external surface.

13. The integrated circuit structure in claim 12, wherein said fuse forms a circuit with said wiring elements.

14. The integrated circuit structure in claim 12, wherein said wiring elements are internal to said integrated circuit structure and are separated from an external portion of said integrated circuit structure by said insulator layer.

15. The integrated circuit structure in claim 12, wherein said portion of said fuse is plated.

* * * * *